United States Patent
Lawrow et al.

(10) Patent No.: US 7,751,503 B2
(45) Date of Patent: Jul. 6, 2010

(54) METHOD FOR ACQUIRING TIMING AND CARRIER SYNCHRONIZATION OF OFFSET-QPSK MODULATED SIGNALS

(75) Inventors: Ivan Lawrow, Sheffield (GB); Stephen Bate, Sheffield (GB)

(73) Assignee: Jennic Limited, Sheffield (GB)

( * ) Notice: Subject to any disclaimer, the term of this patent is extended or adjusted under 35 U.S.C. 154(b) by 982 days.

(21) Appl. No.: 11/412,408

(22) Filed: Apr. 27, 2006

(65) Prior Publication Data

US 2007/0253512 A1 Nov. 1, 2007

(51) Int. Cl.
*H04L 27/14* (2006.01)
(52) U.S. Cl. .......... 375/326; 375/375; 375/332; 375/344; 375/327; 375/325; 370/503; 370/335; 370/342
(58) Field of Classification Search .......... 375/326, 375/375, 332, 344, 327, 325, 281; 370/503, 370/335, 342
See application file for complete search history.

(56) References Cited

U.S. PATENT DOCUMENTS

| | | | | | |
|---|---|---|---|---|---|
| 5,025,455 | A | * | 6/1991 | Nguyen | 375/327 |
| 5,440,268 | A | * | 8/1995 | Taga et al. | 329/308 |
| 6,023,386 | A | * | 2/2000 | Reed et al. | 360/51 |
| 6,081,563 | A | * | 6/2000 | Taga et al. | 375/344 |
| 6,363,126 | B1 | * | 3/2002 | Furukawa et al. | 375/344 |
| 6,650,187 | B1 | * | 11/2003 | Riddle et al. | 331/17 |

OTHER PUBLICATIONS

Kinman, Peter, W. et al., "Carrier Synchronization of Offset QPSK for Deep Space Telemetry," Aerospace Conference Proceedings, 2002. IEEE, vol. 3, 9-16, pp. 3-1372 to 3-1336 (Mar. 2002).
Simon, M.K., "Carrier Synchronization of Offset Quadrature Phase Shift Keying," Telecommunications and Mission Operations Progress Report 42-133, Jan.-Mar. 1998, May 15, 1998.

* cited by examiner

*Primary Examiner*—Eva Y Puente
(74) *Attorney, Agent, or Firm*—Wilmer Cutler Pickering Hale and Dorr LLP

(57) ABSTRACT

Embodiments of the invention consist in a method of carrier synchronization, comprising determining a frequency offset estimate from a rate of change of a phase difference between a local oscillator signal and a carrier signal of a received signal; and adjusting a frequency of the local oscillator signal by the frequency offset estimate.

17 Claims, 5 Drawing Sheets

METHOD FOR ACQUIRING TIMING AND CARRIER SYNCHRONIZATION OF OFFSET-QPSK MODULATED SIGNALS

Embodiments of the present invention relate to a method of carrier synchronization.

BACKGROUND TO THE INVENTION

Phase locked loops are common in many systems such as, for example, receivers in communication systems. Phase locked loops can be used to provide a local oscillator signal which is locked in frequency and phase to a carrier signal of a received communications signal. If the received signal comprises an information signal multiplied by a carrier signal, the received signal is typically mixed with (multiplied by) the local oscillator signal and low-pass filtered to recover the information signal.

A QPSK (Quadrature Phase Shift Keying) modulated signal typically comprises a signal of constant frequency which can have one of four phases, each phase representing two bits. It can be generated, for example, by multiplying two binary information signals, an in-phase signal I(t) and a quadrature-phase signal Q(t), by a carrier signal at a phase of 0° and 90° respectively (i.e. a cosine signal and a sine signal respectively). The resulting signals are then summed to form the QPSK signal.

An ideal received QPSK signal typically comprises the signal R(t) where:

$$R(t) = I(t) \cdot \cos(\omega_1 t + \phi_1) + Q(t) \cdot \sin(\omega_1 t + \phi_1) \quad (1)$$

where:
I(t) is the transmitted in-phase signal,
Q(t) is the transmitted quadrature-phase signal,
$\omega_1$ is the carrier signal frequency, and
$\phi_1$ is the received carrier static phase.

FIG. 1 shows a typical Costas phase locked loop 100 which can be used to demodulate a QPSK signal. The Costas Loop 100 comprises a first mixer 102 which mixes a received signal R(t) with a local oscillator signal provided by a voltage controlled oscillator (VCO) 104. The Costas Loop 100 also comprises a second mixer 106 which mixes the received signal R(t) with the local oscillator signal delayed by 90°, as represented by a 90° delay unit 108.

The output of the first mixer is low-pass filtered by a first low-pass filter (LPF) 110. The output of the second mixer is low-pass filtered by a second low-pass filter 112. If the VCO 104 is generating a sinusoidal signal which is locked in frequency and phase to the incoming signal R(t) (i.e. it is generating a signal proportional to $\cos(\omega_1 t + \phi_1)$), then the output of the first LPF 110 will be the signal I(t), and the output of the second LPF will be the signal Q(t).

To achieve frequency and phase lock, the outputs of the filters 110 and 112 are provided to a phase detection apparatus 114 which is, in practice, a third mixer. The output of the third mixer is provided to a loop filter 116 which is, in practice, a third low pass filter. The output of the filter 116 is a control voltage which is applied to the VCO 104 to control the frequency of its output. Over a period of time, the frequency and phase of the local oscillator signal provided by the VCO 104 will approach those of the carrier signal of the received signal R(t). The receiver is then said to be carrier synchronized with the transmitter.

A typical QPSK demodulator also must achieve timing synchronization (also known as symbol synchronization). The signals Q(t) and I(t) must be sampled at periodic instants to determine their amplitude and therefore the information that the signals are representing. Timing synchronization is typically performed separately from carrier synchronization in QPSK demodulation.

OQPSK (Offset QPSK) is another modulation scheme where the signal Q(t) or I(t) is delayed by half a symbol when the OQPSK is modulated. In the subsequent transmitted symbol, phase shifts are restricted to a maximum of 90° at a time. This gives OQPSK desirable properties over QPSK which can have phase shifts of 180°.

Some OQPSK synchronization schemes introduce a half-symbol delay to the signal I(t) in the carrier synchronization loop. However, the half-symbol delay introduces a carrier phase shift which is no longer negligible when a large carrier frequency offset (difference in frequency between the local oscillator signal and the carrier signal of a received signal R(t)) is present. Therefore these schemes are unsuitable where a large carrier frequency offset is present.

OQPSK synchronization schemes are described in Peter W. Kinman, Jeff B. Berner, "Carrier Synchronization of Offset QPSK for Deep Space Telemetry", *Aerospace Conference Proceedings*, 2002. IEEE, Volume 3, 9-16, March 2002, pages 3-1327 to 3-1336, and M. K. Simon, "Carrier Synchronization of Offset Quadrature Phase Shift Keying", *Telecommunications and Mission Operations Progress Report* 42-133, January-March 1998, May 15, 1998. http://tmo.jpl.nasa.gov/tmo/progress_report/42-133/133J.pdf

SUMMARY OF THE INVENTION

According to a first aspect of embodiments of the invention, there is provided a method of carrier synchronization, comprising determining a frequency offset estimate from a rate of change of a phase difference between a local oscillator signal and a carrier signal of a received signal; and adjusting a frequency of the local oscillator signal by the frequency offset estimate.

Other aspects of embodiments of the invention are defined in the appended claims.

BRIEF DESCRIPTION OF THE DRAWINGS

Embodiments of the invention will now be described, by way of example only, with reference to the accompanying drawings, in which.

DETAILED DESCRIPTION OF EMBODIMENTS OF THE INVENTION

Figure 1:
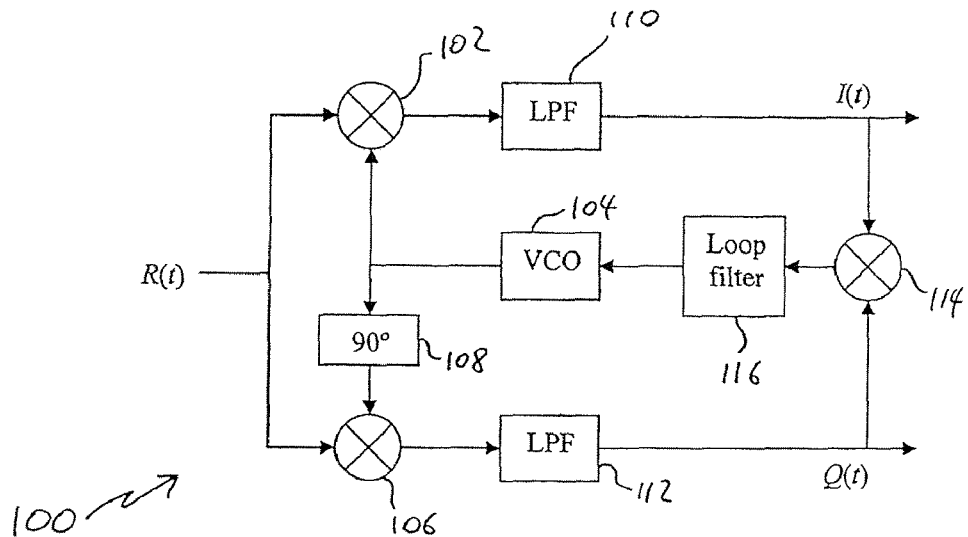
FIG. 1 shows a prior art Costas Loop used for QPSK demodulation.
Figure 2:
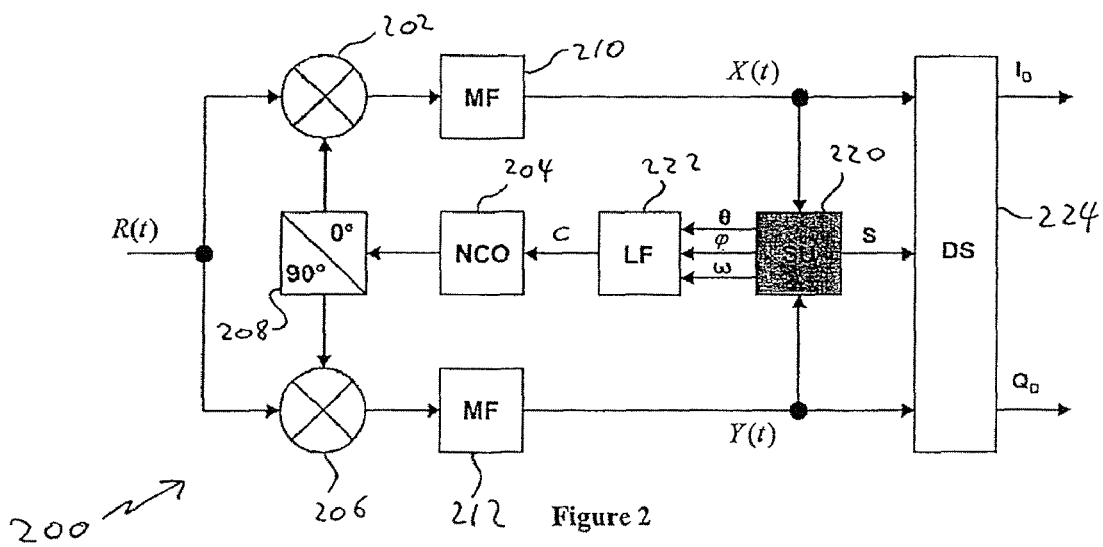
FIG. 2 shows a demodulator according to embodiments of the invention.

The demodulator 200 shown in FIG. 2, which comprises a phase locked loop according to embodiments of the invention, includes a first mixer 202 which mixes a received signal R(t) with a local oscillator signal provided by a numerically controlled oscillator (NCO) 204. The demodulator 200 also comprises a second mixer 206 which mixes the received signal R(t) with the local oscillator signal delayed by 90°, as represented by a 90° delay unit 208.

The output of the first mixer 202 is filtered by a first matched filter (MF) 210. The output of the second mixer 206 is filtered by a second matched filter 212. If the NCO 204 is generating a sinusoidal signal which is locked in frequency and phase to the incoming signal R(t) (i.e. it is generating a signal proportional to $\cos(\omega_1 t + \phi_1)$), then the output X(t) of the first filter 210 will be the signal I(t), and the output Y(t) of the second filter 212 will be the signal Q(t).

The matched filters 210 and 212 have two purposes. Firstly, they suppress the mixing products containing summed frequency terms. Secondly, by having an impulse response matched to the pulse shape of the I(t) and Q(t) signals, the matched filters 210 and 212 increase the signal-to-noise ratio (SNR) of the downconverted I(t) and Q(t) signals by effectively performing an auto-correlation.

The signals X(t) and Y(t) are provided to a synchronization unit (SU) 220. The synchronization unit 220 provides information on the local oscillator signal generated by the NCO 204 to a loop filter 222, which subsequently passes the filtered information to the NCO in the form of a numerical control value. The information comprises three values: $\theta$, $\phi$ and $\omega$. These will be explained in more detail below.

Figure 3:
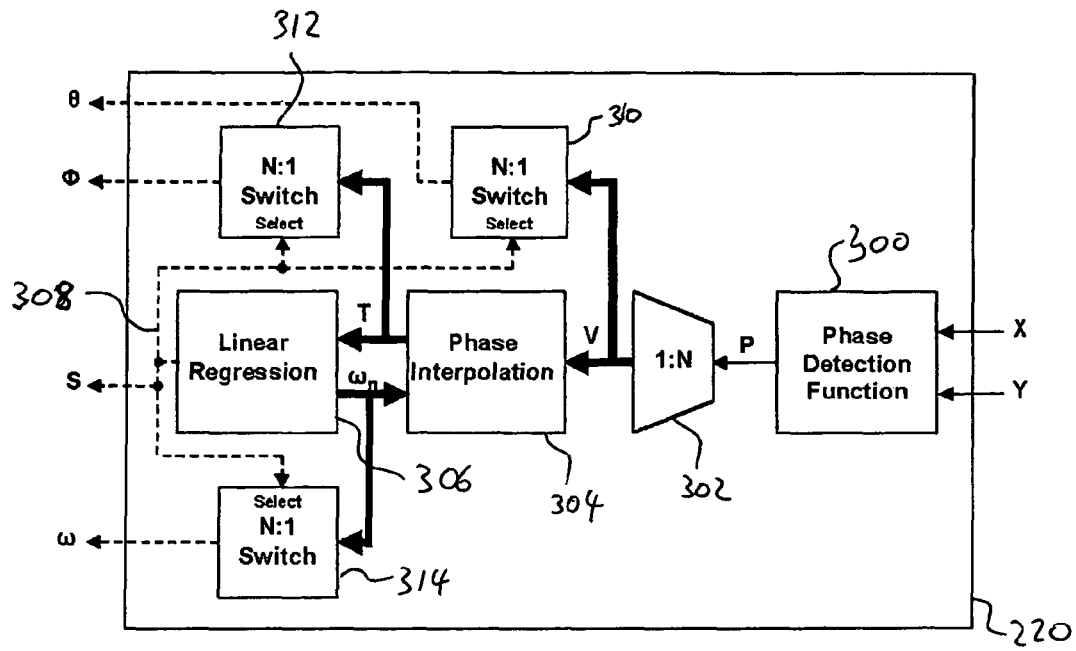
FIG. 3 shows a synchronization unit according to embodiments of the invention.

FIG. 3 shows an embodiment of the synchronization unit 220. The synchronization unit 220 includes a phase detection function module 300 which accepts the signals X(t) and Y(t) as inputs. The phase detection function module 300 provides a plurality of samples $P=\{p_0, p_1, p_2, \ldots\}$ of a phase detection function P(t) to a 1:N demultiplexer 302. The samples P are provided to the demultiplexer 302 at a rate of $2NF_s$, where N is a positive integer and $F_s$ is the symbol rate of the symbols in the signals I(t) and Q(t).

For a received signal R(t) as defined above, the signals X(t) and Y(t) comprise:

$$X(t) = I(t) \cdot \cos((\omega_1 - \omega_2)t + \phi_1 - \phi_2) + Q(t) \sin((\omega_1 - \omega_2)t + \phi_1 - \phi_2) \quad (2)$$

$$Y(t) = Q(t) \cdot \cos((\omega_1 - \omega_2)t + \phi_1 - \phi_2) - I(t) \sin((\omega_1 - \omega_2)t + \phi_1 - \phi_2) \quad (3)$$

where:
- $\omega_1$ is the carrier frequency,
- $\phi_1$ is the received carrier static phase,
- $\omega_2$ is the NCO (local oscillator) frequency, and
- $\phi_2$ is the NCO static phase.

The carrier phase offset is given by:

$$\theta_c(t) = (\omega_1 - \omega_2)t + \phi_1 - \phi_2 \quad (4)$$

Hence:

$$X(t) = I(t) \cdot \cos \theta_c(t) + Q(t) \sin \theta_c(t) \quad (5)$$

$$Y(t) = Q(t) \cdot \cos \theta_c(t) - I(t) \sin \theta_c(t) \quad (6)$$

Dividing (5) by (6) gives:

$$\frac{X(t)}{Y(t)} = \frac{\frac{I(t)}{Q(t)} + \tan\theta_c(t)}{1 - \frac{I(t)}{Q(t)} \cdot \tan\theta_c(t)} \quad (7)$$

Using the identity $$\tan(A+B) = \frac{\tan A + \tan B}{1 - \tan A \cdot \tan B}$$

in equation 7:

$$\frac{X(t)}{Y(t)} = \tan\left(\tan^{-1}\left(\frac{I(t)}{Q(t)}\right) + \theta_c(t)\right) \quad (8)$$

$$\tan^{-1}\left(\frac{X(t)}{Y(t)}\right) = \theta_c(t) + \tan^{-1}\left(\frac{I(t)}{Q(t)}\right) \quad (9)$$

The phase detector function P(t) is defined as:

$$P(t) = \begin{cases} \tan^{-1}\left(\frac{X(t)}{Y(t)}\right) - sgn(X(t) \cdot Y(t)) \cdot \frac{\pi}{4} & \text{for } Y(t) \neq 0 \\ \frac{\pi}{4} \cdot sgn(X(t)) & \text{for } Y(t) = 0 \end{cases} \quad (10)$$

where:

$$sgn(x) = \begin{cases} -1 & \text{for } x < 0 \\ 0 & \text{for } x = 0 \\ 1 & \text{for } x > 0 \end{cases} \quad (11)$$

P(t) is bounded by the limits $-\pi/4 \leq P(t) \leq \pi/4$.

For the general case of $Y(t) \neq 0$, substituting (5), (6) and (9) into (10) gives:

$$P(t) = \theta_c(t) + \tan^{-1}\left(\frac{I(t)}{Q(t)}\right) - \\ sgn\left(\sin 2\theta_c(t) \cdot \frac{Q(t)^2 - I(t)^2}{2} + I(t) \cdot Q(t) \cdot \cos 2\theta_c(t)\right) \cdot \frac{\pi}{4} \quad (12)$$

When the condition $Q(t) = \pm I(t)$ is satisfied, equation (12) reduces to:

$$P(t) = \theta_c(t) \pm \pi/4 - \pm sgn(\cos 2\theta_c(t)) \cdot \pi/4 \quad (13)$$

The values of $\theta_c(t)$ that satisfy P(t) fall within the limits $-\pi/4 < \theta_c(t) < \pi/4$.

Figure 4:
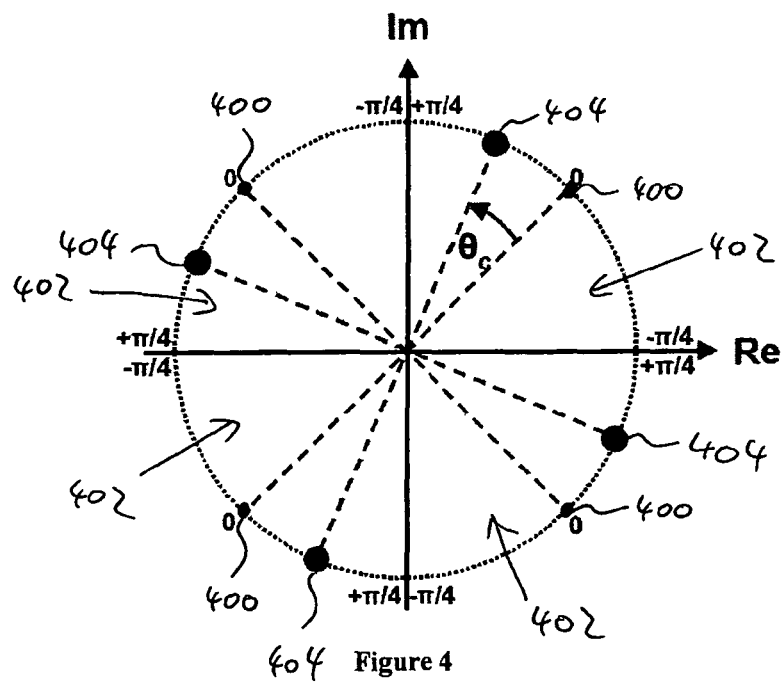
FIG. 4 shows an example of a constellation diagram for QPSK or OQPSK.

FIG. 4 shows a constellation diagram showing the relative positions of the four symbols in an example implementation of QPSK or OQPSK. A symbol 400 lies in each quadrant 402. Each symbol represents two transmitted bits. Points 404 represent the phase of the local oscillator signal when there is a phase difference $\theta_c(t)$ between the carrier of the received QPSK or OQPSK signal and the local oscillator signal. The phase of the local oscillator signal will be displaced from that of one of the symbols 400 by $\theta_c(t)$. The value of $\theta_c(t)$ may be greater than $\pi/4$ or less than $-\pi/4$. Therefore a carrier phase offset estimate $\theta(t)$ is defined as being the phase difference between the local oscillator signal and the phase of the symbol 400 in the same quadrant 402 as the local oscillator signal. The value of θ(t) therefore lies within the range $-\pi/4 \leq \theta(t) \leq \pi/4$ in the example QPSK or OQPSK implementation. It is θ(t) which is determined by the phase detection function module 300.

There is a phase ambiguity between $\theta_c(t)$ and θ(t) as $\theta_c(t)$ may lie outside of the range for θ(t). Therefore, the bounded value $-\pi/4 < \theta_c(t) < \pi/4$ is replaced in equation (13) with θ(t) which yields:

$$P(t)=\theta(t) \qquad (14)$$

Therefore, the phase detection function P(t) equals the carrier phase offset estimate θ(t) when Q(t)=±I(t). The phase locked loop of embodiments of the invention will therefore synchronize the phase of the local oscillator signal with that of one of the symbols 400.

Figure 5:
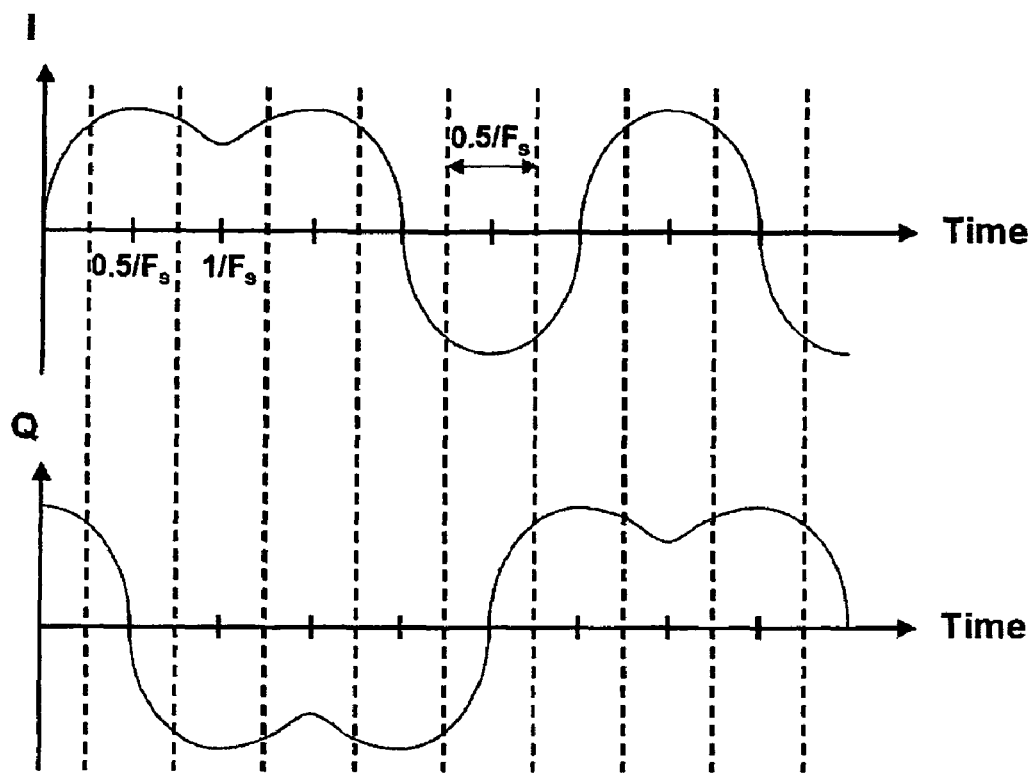
FIG. 5 shows an example of OQPSK Q(t) and I(t) waveforms.

FIG. 5 shows examples of waveforms of the demodulated signals I(t) and Q(t). Each waveform takes the form of a binary signal shaped using a sinusoidal signal of a period $$\frac{2}{F_s},$$

where $F_s$ is the symbol rate of the signals I(t) and Q(t). The condition Q(t)=±I(t) will be satisfied twice in a single symbol period $$\frac{1}{F_s}$$

as shown by vertical dashed lines. The time period between instances when the condition is satisfied is therefore $$\frac{1}{2F_s}.$$

Referring back to FIG. 3, the phase detection function module 300 provides samples of P(t) to the 1:N demultiplexer 302 at a rate of $2NF_s$. The demultiplexer 302 splits the samples into N data streams $V_i(t)$, i=0, ..., N−1, each of which contain samples at a rate of $2F_s$. If samples P={$p_0, p_1, p_2, ...$} are provided to the demultiplexer, then each data stream $V_i(t)$ will contain the samples $V_i$={$p_i, p_{N+i}, p_{2N+i}, p_{3N+i}, ...$}.

Figure 6:
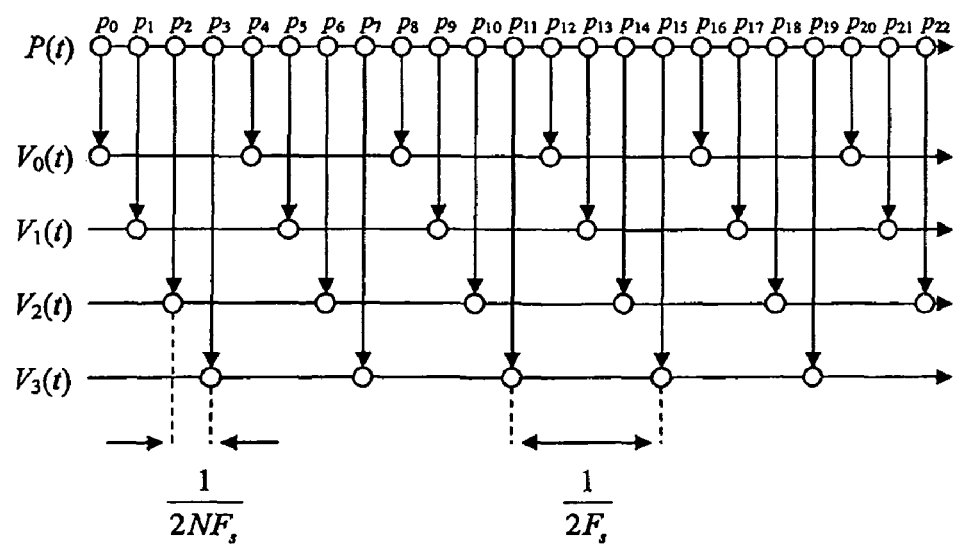
FIG. 6 shows an example of assignment of samples in a data stream to other data streams.

FIG. 6 shows an example of the operation of the demultiplexer when N=4. The horizontal lines represent time and a circle on a line represents a sample of P(t). The vertical arrows show how the samples of P(t) are added to the data streams $V_i(t)$. It can be seen that the data streams $V_i(t)$ are interleaved, and two data streams $V_i(t)$ and $V_{i+1}(t)$ (for example $V_2(t)$ and $V_3(t)$, or $V_3(t)$ and $V_0(t)$) are time-displaced relative to each other by a time period of $$\frac{1}{2NF_s}.$$

This time period is also the time period between samples in P(t). The time period between samples in a data stream $V_i(t)$ is $$\frac{1}{2F_s}.$$

Figures 7A, 7B:
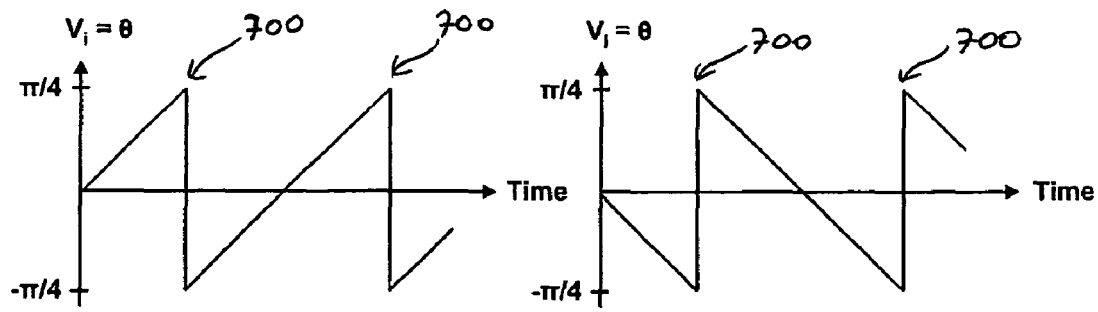
FIGS. 7(a) and (b) show an example of the phase offset θ(t) when the frequency offset is positive and negative respectively.

As the time period between instances when Q(t)=±I(t) is also $$\frac{1}{2F_s},$$

one of the data streams $V_i(t)$ will represent or approximate the function θ(t). This data stream will be referred to herein as $V_i(t)=\theta(t)$. FIG. 7 shows examples of $V_i(t)=\theta(t)$. FIG. 7(a) shows an example where there is a positive carrier phase offset estimate. FIG. 7(b) shows an example where there is a negative carrier phase offset estimate. As θ(t) is bound by the range $-\pi/4 \leq \theta(t) \leq \pi/4$, the value of $V_i(t)$ will also lie within this range. Where the phase difference θ(t) would otherwise make a transition outside of this range, a −π/2 phase shift (positive or negative as appropriate) occurs in $V_i(t)$, as shown at the points 700.

Other data streams $V_i(t) \neq \theta(t)$ may contain irregular waveforms.

Referring back to FIG. 3, the demultiplexer 302 passes samples from all of the data streams $V_i(t)$ continuously to a phase interpolation module 304. The phase interpolation module removes the π/2 phase transitions from the data streams $V_i(t)$, i.e. it interpolates the data streams $V_i(t)$. The phase interpolation module 304 determines N interpolated data streams $T_i$={$t_{0,i}, t_{1,i}, t_{2,i}, ...$}, i=0, ..., N−1 using the following:

$$t_{k,i} = v_{k-1,i} + a_{k,i} \qquad (15)$$

$$a_{k,i} = a_{k-1,i} + w_{k-1,i} \qquad (16)$$

$$w_{k,i} = \begin{cases} \dfrac{\pi}{2} & \text{for } d_{k,i} < -\dfrac{\pi}{4} \\ -\dfrac{\pi}{2} & \text{for } d_{k,i} > \dfrac{\pi}{4} \\ 0 & \text{for } -\dfrac{\pi}{4} \leq d_{k,i} \leq \dfrac{\pi}{4} \end{cases} \qquad (17)$$

$$d_{k,i} = v_{k,i} + a_{k,i} - (v_{k-1,i} + a_{k-1,i}) - w_{k-1,i} - \frac{\omega_{n,i}}{2F_s} \qquad (18)$$

where:

$\omega_{n,i}$ is the gradient of the signal $T_i(t)$ calculated from the $n^{th}$ linear regression;

$F_s$ is the symbol rate of the received signal R(t); and $a_{0,i}=w_{0,i}=\omega_{0,i}=0$.

Figure 8:
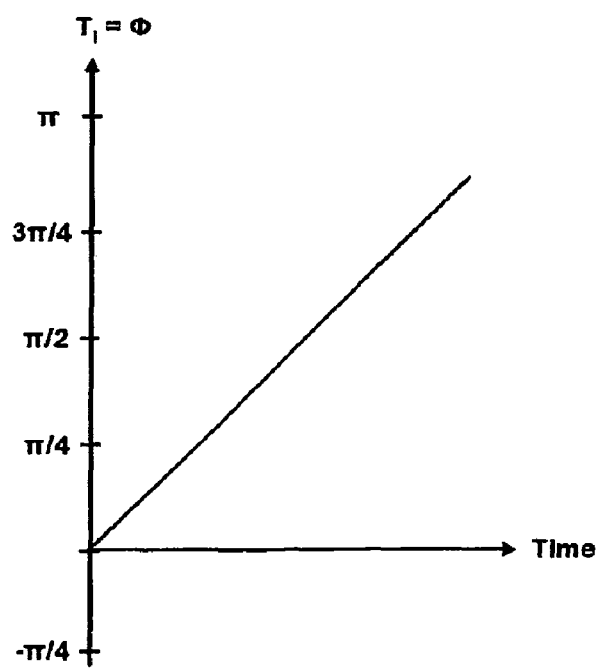
FIG. 8 shows an example of an interpolated phase offset.

FIG. 8 shows an example of a data stream $T_i(t)$ produced by the phase interpolation module 304 when interpolating the data stream $V_i(t)$ shown in FIG. 7(a). It can be seen that the π/2 phase transitions have been removed and the resulting data stream $T_i(t)$ is a straight line. When the data stream $V_i(t)=\theta(t)$ is interpolated, the resulting data stream $T_i(t)$ is defined as an interpolated carrier phase offset estimate φ(t).

The phase interpolation module 304 provides samples from the data streams $T_i(t)$ continuously to a linear regression module 306, as shown in FIG. 3. The linear regression module provides the values of $\omega_{n,i}$, n≥1 to the phase interpolation module 304. The linear regression module 306 does this by performing a linear regression calculation, detailed below, on a finite "window" of W samples from each of the data streams $T_i(t)$. Therefore, the linear regression module calculates the (n+1)th gradient $\omega_{n,i}$ on the samples $T_i$={$t_{nW,i}, t_{nW+1,i}, t_{nW+2,i}, ..., t_{nW+(W-1),i}$}. Therefore, for the first W samples passed to the linear regression module 306 from the phase interpolation module 304, the linear regression module has passed no gradient to the phase interpolation module. This "initial" gradient $\omega_{0,i}$ is therefore defined as zero. In certain embodiments, the linear regression module 306 may pass a zero value gradient to the phase interpolation module 304 for this purpose. Additionally or alternatively, the phase interpolation module may automatically assume that $\omega_{0,i}=0$.

The linear regression module determines the gradients $\omega_{n,i}$ using a linear regression calculation as follows:

$$ss_{xx,i} = \sum_{j=0}^{W-1} (x_{j+n} - \bar{x}_n)^2 \qquad (19)$$

$$ss_{xy,i} = \sum_{j=0}^{W-1} (x_{j+n} - \bar{x}_n) \cdot (t_{j+n,i} - \bar{t}_{i+n}) \qquad (20)$$

$$\omega_{n,i} = \frac{ss_{xy,i}}{ss_{xx,i}} \qquad (21)$$

where:
$x_{(n-1)W+j}$ are values of time t at instants when the samples $t_{(n-1)W+j,i}$ are taken;
$\bar{x}_n$ is the mean value of all $x_{(n-1)W+j}$, $0 \leq j \leq (W=1)$; and
$\bar{t}_n$ is the mean value of all $t_{(n-1)W+j,i}$, $0 \leq j \leq (W-1)$ from data stream $T_i(t)$.

The linear regression module 306 also calculates a sum of squared errors (SSE) for each data stream $T_i(t)$ as follows:

$$ss_{yy,i} = \sum_{j=0}^{W-1} (t_{j+n,i} - \bar{t}_{i+n})^2 \qquad (22)$$

$$SSE_i = ss_{yy,i} - \frac{(ss_{xy,i})^2}{xx_{xx,i}} \qquad (23)$$

The smallest $SSE_i$ corresponds to the interpolated data stream $T_i(t)$ that is closest to a straight line. That data stream $T_i(t)$ is taken to be the interpolated carrier phase offset estimate $\phi(t)$ as it is unlikely that the waveforms of the other interpolated data streams $T_i(t)$ form a straight line. The linear regression module therefore provides a further control signal 308, as shown in FIG. 3, which is used to control the outputs from the synchronization unit 220 as explained below. In certain embodiments, the control signal 308 takes the value i associated with $V_i(t)=\theta(t)$ and $T_i(t)=\phi(t)$.

The demultiplexer 302 provides the data streams $V_i(t)$ to a first N:1 switch 310. The switch 310 also accepts the control signal 308. The switch 310 outputs a selected data stream $V_i(t)$ from the synchronization unit 220 according to the value of the control signal 308. Thus the selected data stream $V_i(t)$ is the data stream comprising the carrier phase offset estimate $\theta(t)$.

The phase interpolation module 304 provides the interpolated data streams $T_i(t)$ to a second N:1 switch 312. The second switch 312 outputs a selected interpolated data stream $T_i(t)$ according to the value of the control signal 308. Thus the selected interpolated data stream $T_i(t)$ is the interpolated data stream closest to a straight line and hence comprising the interpolated carrier phase offset estimate $\phi(t)$.

The linear regression module 306 provides the calculated gradients $\omega_{n,i}$ to a third N:1 switch 314. The third switch 312 outputs a selected gradient $\omega_{n,i}$ according to the value of the control signal 308. The selected gradient $\omega_{n,i}$ is defined as the carrier frequency offset estimate $\omega$. The maximum carrier frequency offset estimate $\omega_{max}$ detectable by the phase detection function module 300 is given by:

$$\omega_{max} = \frac{\pm \pi/4}{1/2F_s} = \pm F_s \cdot \frac{\pi}{2} \qquad (24)$$

The linear regression module 306 also outputs the control signal 308 from the synchronization unit 220 as a symbol timing estimate S. The symbol timing estimate S can be used to interpret the signals Q(t) and I(t) as explained below.

The three values $\theta(t)$, $\phi(t)$ and $\omega$ can be used to achieve phase and frequency lock between the local oscillator signal and the carrier signal of the received signal R(t). The value of $\omega$ can be used to perform a fast frequency adjustment as the value of $\omega$ is the carrier frequency offset estimate, i.e. the approximate difference in frequency between the local oscillator signal and the carrier signal of the received signal R(t). Thus the present invention provides faster frequency correction when compared to prior art systems in the presence of large frequency offsets (i.e. when the magnitude of the frequency offset in radians per second is comparable with the symbol rate in symbols per second). The value of $\phi(t)$ can be used to perform fine frequency adjustment. The value of $\theta(t)$ can be used to perform phase correction.

In certain embodiments, the carrier frequency offset estimate $\omega$ may be obtained instead from the carrier phase offset estimate $\theta(t)$. However, using the interpolated carrier phase offset estimate $\phi(t)$ improves the accuracy of $\omega$.

Figure 9:
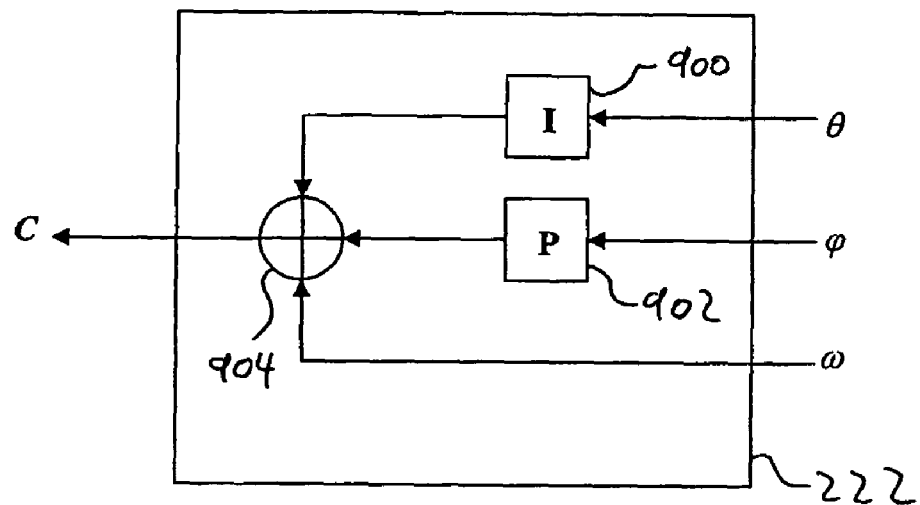
FIG. 9 shows an example of an implementation of a loop filter.

Referring back to FIG. 3, the outputs $\theta(t)$, $\phi(t)$ and $\omega$ from the synchronization unit are provided to the loop filter 222. The loop filter carries out an appropriate function on the three values to determine a control value C to be provided to the NCO 204. FIG. 9 shows an example implementation of the loop filter. The filter 222 comprises an integral part 900 for integrating $\theta(t)$, and a proportional part 902 for scaling $\phi(t)$. The filter also comprises a summer 904 for summing $\omega$ and the outputs of the integral part 900 and the proportional part 902. The output of the summer 904 is the output C from the loop filter 222.

Figure 10:
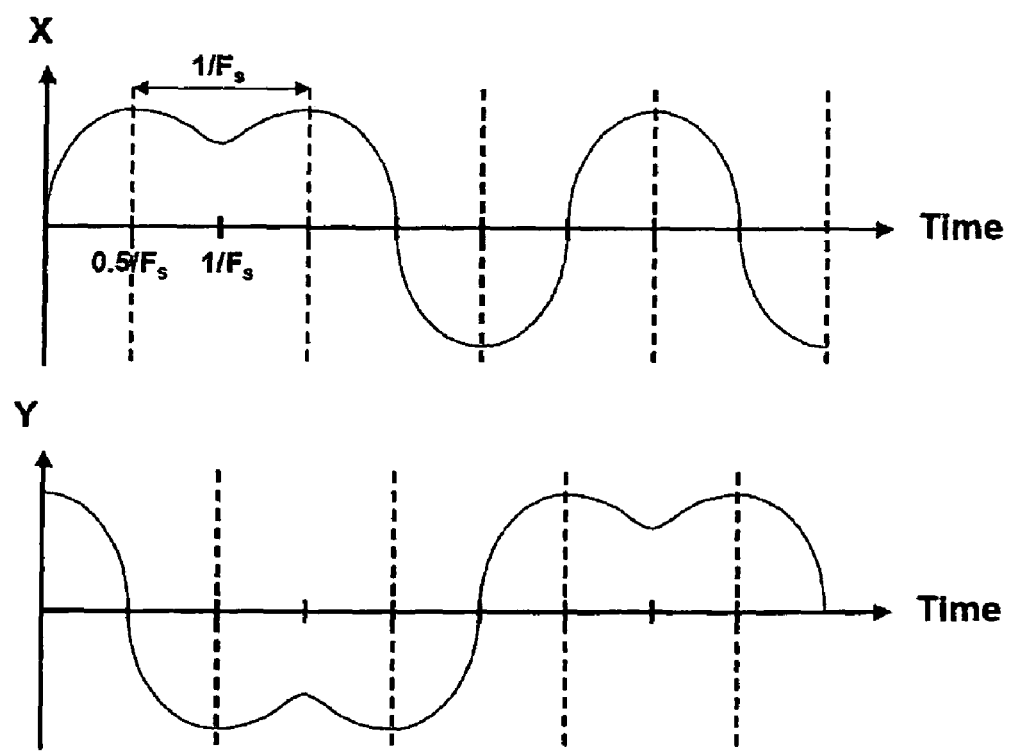
FIG. 10 shows the example waveforms of FIG. 5 with peaks indicated.

Referring back to FIG. 2, the synchronization unit 220 provides the symbol timing estimate S to a downsampler (DS) 224. The symbol timing estimate is effectively a value which indicates the instances in time when $Q(t)=\pm I(t)$ as shown in FIG. 5. This value can be used to determine the position of the peaks in the Q(t) and I(t) waveforms, which are approximately half-way between instances when $Q(t)=\pm I(t)$. FIG. 10 shows the example waveforms for Q(t) and I(t) from FIG. 5. The dashed vertical lines in FIG. 10 show the peaks of each waveform. The downsampler 224 samples the waveforms at these instances in time and converts the sampled values to binary bits as appropriate. The downsampler 224 then outputs binary bit streams $Q_D$ and $I_D$ corresponding to the signals Q(t) and I(t) respectively. It can be seen that, for the OQPSK-encoded signals Q(t) and I(t), the peaks for Q(t) lie between the peaks for I(t).

The demodulator according to embodiments of the present invention may be implemented in a number of ways. For example, the demodulator may be implemented entirely using software that can be executed, for example, on a data processor capable of executing the software. Alternatively, the demodulator may be implemented in digital hardware using, for example, a programmable logic device (such as, for example, a FPGA) or an ASIC. The demodulator may also be implemented using a plurality of data processors. Where appropriate, the phase detection function module 300 (shown in FIG. 3) may be implemented in digital hardware using a CORDIC (COordinate Rotation DIgital Computer) algorithm, for example.

The demodulator may also be implemented fully or in part as an analog circuit using analog components as appropriate. Hence, a "signal" or a "data stream" described herein may comprise a plurality of discrete samples or a continuous signal.

In alternative embodiments, the demodulator is instead used as a phase locked loop and may omit certain components such as, for example, the downsampler 224 of FIG. 2. The output from the demodulator may then comprise, for example, the phase and frequency-locked local oscillator signal or the signals X(t) and Y(t), instead of the binary bit streams $Q_D$ and $I_D$.

The demodulator may be used in a wide variety of devices to demodulate an incoming signal and/or achieve frequency and/or phase lock with the carrier signal of an incoming signal. For example, the demodulator may be used in a wireless communications device such as a mobile phone. The demodulator may also be used in wired communications devices, or in any device which may require the use of a demodulator.

Embodiments of the invention are used with signals using an example of OQPSK modulation. Embodiments of the invention may be used with signals modulated using other schemes, such as other implementations of OQPSK, QPSK and other modulation schemes.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method of carrier synchronisation, comprising:
   determining a phase difference between a local oscillator signal and a carrier signal of a received signal by performing a phase detection function P(t) such that the value of P(t) at periodic instants indicates the phase difference θ between the carrier signal of the received signal R(t) and at least one of first and second local oscillator signals, wherein $$P(t) = \begin{cases} \tan^{-1}\left(\frac{X(t)}{Y(t)}\right) - sgn(X(t) \cdot Y(t)) \cdot \frac{\pi}{4} & \text{for } Y(t) \neq 0 \\ \frac{\pi}{4} \cdot sgn(X(t)) & \text{for } Y(t) = 0 \end{cases}$$

where X(t) is derived from the received signal R(t) mixed with a first local oscillator signal, and Y(t) is derived from the received signal R(t) mixed with a second local oscillator signal;

determining a frequency offset estimate from a rate of change of the phase difference between the local oscillator signal and the carrier signal of the received signal; and adjusting a frequency of the local oscillator signal by the frequency offset estimate.

2. A method as claimed in claim 1, wherein determining a frequency offset estimate comprises:
   determining an estimate of a difference between the frequency of the carrier signal of the received signal R(t) and at least one of the first and second local oscillator signals from the phase detection function.

3. A method as claimed in claim 2, comprising mixing the received signal R(t) with the first local oscillator signal and filtering to produce the first signal X(t).

4. A method as claimed in claim 2, comprising mixing the received signal R(t) with the second local oscillator signal and filtering to produce the second signal Y(t).

5. A method as claimed in claim 1, wherein determining the frequency offset estimate comprises determining a gradient of the phase difference.

6. A method as claimed in claim 1, wherein determining the frequency offset estimate comprises interpolating the phase difference.

7. A method as claimed in claim 6, wherein determining the frequency offset estimate comprises determining a gradient of the interpolated phase difference.

8. A method as claimed in claim 6, wherein determining the frequency offset estimate comprises determining a most recent value of the interpolated phase difference.

9. A method as claimed in claim 1, wherein the signal X(t) is derived from the received signal R(t) mixed with the first local oscillator signal, the signal Y(t) is derived from the received signal R(t) mixed with the second local oscillator signal, the signals X(t) and Y(t) include at least one of quadrature components Q(t) and I(t) of the received signal R(t) and the periodic instants are instants where Q(t)=±I(t).

10. A method as claimed in claim 6, wherein performing the phase detection function comprises determining N time-displaced signals $V_i$ from P(t), wherein the signals $V_i$, are displaced by $$\frac{1}{2NF_s}$$

seconds, where $$\frac{1}{F_s}$$

is the inter-symbol period of the received signal R(t), and where N is an integer greater than 1.

11. A method as claimed in claim 10, wherein determining the signals $V_i$ comprises determining pluralities of samples $V_i = \{v_{0,i}, v_{1,i}, v_{2,i}, \ldots\}$ from P(t).

12. A method as claimed in claim 11, wherein interpolating the phase difference comprises determining N interpolated signals $T_i = \{t_{0,i}, t_{1,i}, t_{2,i}, \ldots\}$ from the signals $V_i$.

13. A method as claimed in claim 12, wherein:

$$t_{k,i} = v_{k-1,i} + a_{k,i}$$

$$a_{k,i} = a_{k-1,i} + w_{k-1,i}$$

$$w_{k,i} = \begin{cases} \frac{\pi}{2} & \text{for } d_{k,i} < -\frac{\pi}{4} \\ -\frac{\pi}{2} & \text{for } d_{k,i} > \frac{\pi}{4} \\ 0 & \text{for } -\frac{\pi}{4} \leq d_{k,i} \leq \frac{\pi}{4} \end{cases}$$

$$d_{k,i} = v_{k,i} + a_{k,i} - (v_{k-1,i} + a_{k-1,i}) - w_{k-1,i} - \frac{\omega_{n,i}}{2F_s}$$

where:

$\omega_{n,i}$ is the gradient of signal $T_i$, calculated from the $n^{th}$ linear regression $n \geq 1$;

$F_s$ is the symbol rate of the received signal $R(t)$; and $a_{0,i} = w_{0,i} = \omega_{0,i} = 0$, $t_{k,i}$ is the $k^{th}$ sample of the signal $T_i$, $d_{k,i}$ is the $k^{th}$ sample of a phase-difference signal associated with signal $T_i$, $w_{k,i}$ is the $k^{th}$ sample of a phase-transition signal associated with signal $T_i$, and $a_{k,i}$ is the $k^{th}$ sample of an accumulated phase-transition signal associated with signal $T_i$.

14. A method as claimed in claim 13, comprising calculating $\omega_{n,i}$ using a linear regression calculation for W previous samples of $T_i$, wherein W is an integer greater than 1.

15. A method as claimed in claim 1, comprising providing the frequency offset estimate to a controllable oscillator.

16. A method as claimed in claim 1, wherein the received signal R(t) is an OQPSK signal.

17. A demodulator comprising:

an input for receiving a received signal R(t);

a controllable oscillator for generating a first local oscillator signal and a second local oscillator signal;

a first mixer for mixing the received signal R(t) with the first local oscillator signal;

a first filter for filtering an output of the first mixer to produce a first signal X(t);

a second mixer for mixing the received signal R(t) with the second local oscillator signal;

a second filter for filtering an output of the second mixer to produce a second signal Y(t);

a data processor arranged to perform a phase detection function on P(t) on X(t) and Y(t) and determine a frequency offset estimate from a rate of change of the phase detection function, such that the value of P(t) at periodic instants indicates a phase difference θ between a carrier signal of the received signal R(t) and at least one of first and second local oscillator signals, wherein:

$$P(t) = \begin{cases} \tan^{-1}\left(\frac{X(t)}{Y(t)}\right) - sgn(X(t) \cdot Y(t)) \cdot \frac{\pi}{4} & \text{for } Y(t) \neq 0 \\ \frac{\pi}{4} \cdot sgn(X(t)) & \text{for } Y(t) = 0 \end{cases}$$

a loop filter for filtering the frequency offset estimate to produce a control value and providing the control value to the controllable oscillator.

* * * * *